United States Patent
Forbes et al.

(10) Patent No.: US 6,512,695 B2
(45) Date of Patent: Jan. 28, 2003

(54) FIELD PROGRAMMABLE LOGIC ARRAYS WITH TRANSISTORS WITH VERTICAL GATES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/184,546

(22) Filed: Jun. 28, 2002

(65) Prior Publication Data

US 2002/0167839 A1 Nov. 14, 2002

Related U.S. Application Data

(62) Division of application No. 09/583,584, filed on May 31, 2000, now Pat. No. 6,420,902.

(51) Int. Cl.$^7$ ................................................ G11C 16/04
(52) U.S. Cl. ............................ 365/185.17; 365/185.26
(58) Field of Search ........................ 365/185.17, 185.26, 365/185.33; 326/39, 41, 104; 257/314, 315

(56) References Cited

U.S. PATENT DOCUMENTS

| | | | |
|---|---|---|---|
| 4,051,354 A | 9/1977 | Choate | 235/312 |
| 4,673,962 A | 6/1987 | Chatterjee et al. | 357/23.6 |
| 4,962,327 A | 10/1990 | Iwazaki | 365/230.06 |
| 5,327,380 A | 7/1994 | Kersh, III et al. | 365/195 |
| 5,386,132 A | 1/1995 | Wong | 257/316 |
| 5,583,360 A | 12/1996 | Ruth et al. | 257/316 |
| 5,625,213 A | 4/1997 | Hong et al. | 257/321 |
| 5,661,055 A | 8/1997 | Hsu et al. | 438/259 |

(List continued on next page.)

OTHER PUBLICATIONS

"Frequently–Asked Questions (FAQ) About Programmable Logic", *OptiMagic, Inc.*, http://www.optimagic.com/faq.html, (1997), pp. 1–18.

Chen, W.., et al., "Very uniform and high aspect ratio anisotrophy SIO2 etching process in magnetic neutral loop discharge plasma", *J. Vac. Sci. Technol. A, 17*(5) (1999), pp. 2546–2550.

(List continued on next page.)

*Primary Examiner*—Trong Phan
(74) *Attorney, Agent, or Firm*—Schwegman, Lundberg, Woessner & Kluth, P.A.

(57) ABSTRACT

Structures and methods for programmable logic arrays are provided with logic cells, or floating gate transistors, which can operate with lower applied control gate voltages than conventional programmable logic arrays. The programmable logic arrays of the present invention do not increase the costs or complexity of the fabrication process. According to the teachings of the present invention, the floating gate capacitance in the logic cells is much smaller than the control gate capacitance such that the majority of any voltage applied to the control gate will appear across the floating gate thin tunnel oxide. The programmable logic arrays include a plurality of input lines for receiving an input signal and a plurality of output lines. One or more arrays is provided which includes a first logic plane and a second logic plane connected between the input lines and the output lines. The first logic plane and the second logic plane comprise a plurality of logic cells arranged in rows and columns for providing a sum-of-products term on the output lines responsive to the received input signal. Each logic cell includes a source and a drain region in a horizontal substrate with a channel region therebetween. A first vertical gate is located above a portion of the channel region and separated from the channel region by a first oxide thickness. A second vertical gate is located above another portion of the channel region and separated therefrom by a second oxide thickness.

40 Claims, 12 Drawing Sheets

U.S. PATENT DOCUMENTS

| | | | | |
|---|---|---|---|---|
| 5,793,080 | A | 8/1998 | Hwang | 257/316 |
| 5,847,425 | A | 12/1998 | Yuan et al. | 257/315 |
| 5,910,912 | A | 6/1999 | Hsu et al. | 365/185.01 |
| 5,991,225 | A | 11/1999 | Forbes et al. | 365/230.06 |
| 6,078,076 | A | 6/2000 | Lin et al. | 257/321 |
| 6,093,945 | A | 7/2000 | Yang | 257/317 |
| 6,124,729 | A | 9/2000 | Noble et al. | 326/41 |
| 6,133,601 | A | 10/2000 | Watanabe | 257/314 |
| 6,208,164 | B1 | 3/2001 | Noble et al. | 326/41 |
| 6,219,299 | B1 * | 4/2001 | Forbes et al. | 257/315 |
| 6,222,788 | B1 | 4/2001 | Forbes et al. | 365/230.06 |
| 6,377,070 | B1 * | 4/2002 | Forbes | 326/41 |

OTHER PUBLICATIONS

Dipert, Brian., "Flash Memory Goes Mainstream", *IEEE Spectrum, 30*, (Oct. 1993), 48–52.

Hodges, D..A., et al., *Analysis and Design of Digital Integrated Circuits*, McGraw–Hill Book Company, 2nd Edition, (1988), 394–396.

Hodges, D..A., *Analysis and Design of Digital Integrated Circuits, 2nd Edition*. McGraw–Hill Publishing. New York, (1988), pp. 354–357.

Horiguchi, N.., et al., "A Direct Tunneling Memory (DTM) Utilizing Novel Floating Gate Structure", *Proceedings of IEDM 99*, (Dec., 1999), 922–924.

Johnson, J., et al., "IBM's 0.5 micrometer Embedded Flash Memory Technology", *MicroNews, 4(3)*, http://www.chips.ibm.com/micronews/vol14_no3/flash.html, (1998), pp. 1–7.

Landheer, D.., et al., "Formation of high–quality silicon dioxide films by electron cyclotron resonance plasma oxidation and plasma–enhanced chemical vapour deposition", *Thin Solid Films, 293*, (1997), pp. 52–62.

Moore, Will.R., "A Review of Fault–Tolerant Techniques for the Enhancement of Integrated Ccircuit Yield", *Proceedings fo the IEEE, 74(5)*, (May 1986), 684–698.

Nozawa, R.., et al., "Low temperature polycrystalline silicon film formation with and without charged species in an electron cyclotron resonace $SiH_4/H_2$ plasma–enhanced chemical vapor deposition", *J. Vac. Sci. Technol. A, 17(5)*, (1999), pp. 2542–2545.

Patel, P.., et al., "Low temperature VUV enhanced growth of thin silicon dioxide films", *Applied Surface Science, 46*, (1990), pp.352–356.

Rueger, N..R.,et al. , "Selective etching of $SiO_2$ over polycrystalline silicon using $CHF_3$ in an inductively coupled plasma", *J. Vac. Sci. Technol. A, 17(5)*, (1999), pp. 2492–2502.

Shindo, W..,et al., "Low–temperature large–grain poly–Si direct deposition by microwave plasma enhanced chemical vapor disposition using $SiH_4/Xe$", *J. Vac. Sci. Technol. A, 17(5)*, (1999),pp. 3134–3138.

Usami, K.., et al., "Thin Si Oxide films for MIS tunnel emitter by hollow cathode enhanced plasma", *Thin Films, 281–282*, (1996), pp. 412–414.

Vallon, S.., et al., "Polysilicon–germanium gate patterning studies in a high density plasma helicon source",*J. Vac. Sci. Technol. A, 15(4)*, (1997),pp. 1874–1880.

* cited by examiner

FIELD PROGRAMMABLE LOGIC ARRAYS WITH TRANSISTORS WITH VERTICAL GATES

CROSS REFERENCE TO RELATED APPLICATION(S)

This application is a division of U.S. patent application 09/583,584, filed on May 31, 2000, the specification of which is incorporated herein by reference.

This application is related to the following co-pending, commonly assigned U.S. patent applications: U.S. patent application Ser. No. 09/584,566, filed on May 31, 2000, entitled "Horizontal Memory Devices with Vertical Gates," and U.S. patent application Ser. No. 09/584,564, filed on May 31, 2000, entitled "Programmable Memory Decode Circuits with Transistors with Vertical Gates," the disclosures of which are herein incorporated by reference.

TECHNICAL FIELD OF THE INVENTION

This invention relates generally to integrated circuits and in particular to field programmable logic arrays with transistors with vertical gates.

BACKGROUND OF THE INVENTION

Logic circuits are an integral part of digital systems, such as computers. These devices present a problem to integrated circuit manufacturers, who cannot afford to make integrated logic circuits perfectly tailored to the specific needs of every customer. Instead, general purpose very large scale integration (VLSI) circuits are defined. VLSI circuits serve as many logic roles as possible, which helps to consolidate desired logic functions. However, random logic circuits are still required to tie the various elements of a digital system together.

Several schemes are used to implement these random logic circuits. One solution is standard logic, such as transistor-transistor logic (TTL). TTL integrated circuits are versatile because they integrate only a relatively small number of commonly used logic functions. The drawback is that large numbers of TTL integrated circuits are typically required for a specific application. This increases the consumption of power and board space, and drives up the overall cost of the digital system.

Other alternatives include fully custom logic integrated circuits and semi-custom logic integrated circuits, such as gate arrays. Custom logic circuits are precisely tailored to the needs of a specific application. This allows the implementation of specific circuit architectures that dramatically reduces the number of parts required for a system. However, custom logic devices require significantly greater engineering time and effort, which increases the cost to develop these circuits and may also delay the production of the end system.

Semi-custom gate arrays are less expensive to develop and offer faster turnaround because the circuits are typically identical except for a few final-stage steps, which are customized according to the system design specifically. However, semi-custom gate arrays are less dense, so that it takes more gate array circuits than custom circuits to implement a given amount of random logic.

Between the extremes of general purpose devices on the one hand and custom and semi-custom gate arrays on the other, are programmable logic arrays (PLAs). PLAs which are programmable out in the field are known as field programmable logic arrays (FPLAs). FPLAs provide a more flexible architecture via user-programmed on-chip fuses or switches to perform specific functions for a given application. FPLAs can be purchased "off the shelf" like standard logic gates and are custom tailored like gate arrays in a matter of minutes.

To use FPLAs, system designers draft equations describing how the hardware is to perform, and enter the equations into a FPLA programming machine. The unprogrammed FPLAs are inserted into the machine, which interprets the equations and provides appropriate signals to the device to program the FPLA which will perform the desired logic function in the user's system.

Recently, FPLAs based on erasable-programmable-read-only memory cells (EPROMs) fabricated with CMOS (complimentary-metal-oxide-semiconductor) technology have been introduced. Such devices employ floating gate transistors as the FPLA switches, which are programmed by hot electron effects. The EPROM cells are erased by exposure to ultraviolet light or other means. EEPROMs (Electrically Erasable Programmable Read Only Memory) can be erased and programmed while in circuit using Fowler-Nordheim tunneling. However, a disadvantage of current EEPROMs is that they have a large cell size and require two transistors per cell. Herein is where one of the problem lies.

Technological advances have permitted semiconductor integrated circuits to comprise significantly more circuit elements in a given silicon area. To achieve higher population capacities, circuit designers strive to reduce the size of the individual circuit elements to maximize available die real estate. FPLAs are no different than the other circuit elements in that denser circuits are required to support these technological advances.

Another important problem with EEPROM, EAPROM (electrically alterable programmable read only memory), and flash memory devices is the adverse capacitance ratio between the control gate and the floating gate. That is, the capacitance between the control gate to floating gate (CCG) is about the same as the floating gate to substrate capacitance (CFG). FIG. 1A is a block diagram of a horizontal EEPROM, EAPROM, or flash memory device formed according to the teachings of the prior art. As shown in FIG. 1A, conventional horizontal floating gate transistor structure 101 includes a source region 110 and a drain region 112 separated by a channel region 106 in a horizontal substrate 100. A floating gate 104 is separated by a thin tunnel gate oxide 105 shown with a thickness (t1). A control gate 102 is separated from the floating gate 104 by an intergate dielectric 103 shown with a thickness (t2). Such conventional devices must by necessity have a control gate 102 and a floating gate 104 which are about the same size in width.

FIG. 1B is a block diagram of a vertical EEPROM, EAPROM, or flash memory device formed according to the disclosure in a co-pending, commonly assigned application by W. Noble and L. Forbes, entitled "Field programmable logic array with vertical transistors," Ser. No. 09/032,617, filed Feb. 27, 1998. FIG. 1B illustrates that vertical floating gate transistor structures have a stacked source region 110 and drain region 112 separated by a vertical channel region 106. The vertical floating gate transistor shown in FIG. 1B further includes a vertical floating gate 104 separated by a thin tunnel gate oxide 105 from the channel region 106. A vertical control gate 102 is separated from the floating gate 104 by an intergate dielectric 103. As shown in FIG. 1B, the vertical control gate 102 and the vertical floating gate 104 are likewise about the same size in width relative to the channel region 106.

Conventionally, the insulator, or intergate dielectric, 103 between the control gate 102 and the floating gate 104 is thicker (t2) than the gate oxide 105 (t1) to avoid tunnel current between the gates. The insulator, or intergate dielectric, 103 is also generally made of a higher dielectric constant insulator 103, such as silicon nitride or silicon oxynitride. This greater insulator thickness (t2) tends to reduce capacitance. The higher dielectric constant insulator 103, on the other hand, increases capacitance. As shown in FIG. 1C, the net result is that the capacitance between the control gate and the floating gate (CCG) is about the same as the gate capacitance of the thinner gate tunneling oxide 105 between the floating gate and the substrate (CFG). This undesirably results in large control gate voltages being required for tunneling, since the floating gate potential will be only about one half that applied to the control gate.

As design rules and feature size (F) in floating gate transistors continue to shrink, the available chip surface space in which to fabricate the floating gate also is reduced. In order to achieve a higher capacitance between the control gate and floating gate (CCG) some devices have used even higher dielectric constant insulators between the control gate and floating gate. Unfortunately, using such higher dielectric constant insulators involves added costs and complexity to the fabrication process.

Therefore, there is a need in the art to provide field programmable logic arrays which can operate with lower control gate voltages and which do not increase the costs or complexity of the fabrication process. Further such devices should desirably be able to scale with shrinking design rules and feature sizes in order to provide even higher density integrated circuits.

SUMMARY OF THE INVENTION

The above mentioned problems with field programmable logic arrays (PLA's) and other problems are addressed by the present invention and will be understood by reading and studying the following specification. Structures and methods for programmable logic arrays are provided with logic cells, or floating gate transistors, which can operate with lower applied control gate voltages than conventional programmable logic arrays. The programmable logic arrays of the present invention do not increase the costs or complexity of the fabrication process. These arrays and methods are fully scalable with shrinking design rules and feature sizes in order to provide even higher density integrated circuits. The total capacitance of the logic cells within the programmable logic arrays is about the same as that for the prior art of comparable source and drain spacings. However, according to the teachings of the present invention, the floating gate capacitance in the logic cells is much smaller than the control gate capacitance such that the majority of any voltage applied to the control gate will appear across the floating gate thin tunnel oxide. Thus, the logic cells in the PLA's of the present invention can be programmed by tunneling of electrons to and from the silicon substrate at lower control gate voltages than is possible in the prior art.

In one embodiment of the present invention, a novel programmable logic array is provided. The PLA includes a plurality of input lines for receiving an input signal and a plurality of output lines. One or more arrays is included in the present invention including a first logic plane and a second logic plane connected between the input lines and the output lines. The first logic plane and the second logic plane include a plurality of logic cells arranged in rows and columns for providing a sum-of-products term on the output lines responsive to the received input signal. According to the teachings of the present invention each logic cell includes a source region and a drain region in a horizontal substrate separated by a channel region. A first vertical gate is located above a first portion of the channel region and separated from the channel region by a first thickness insulator material. A second vertical gate is located above another portion of the channel region and separated therefrom by a second thickness insulator material. According to the teachings of the present invention, the second vertical gate opposes the first vertical gate and is separated from the first vertical gate by an intergate dielectric.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE INVENTION

Figure 1A:
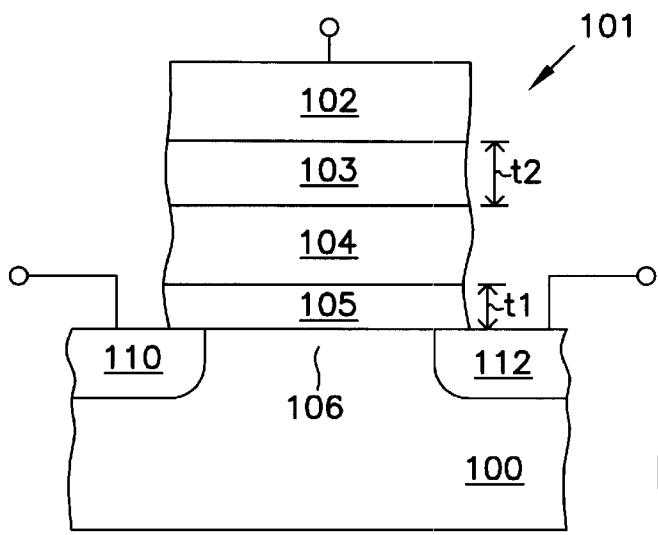
FIG. 1A is a block diagram of a horizontal EEPROM, EAPROM, or flash memory device formed according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2A:
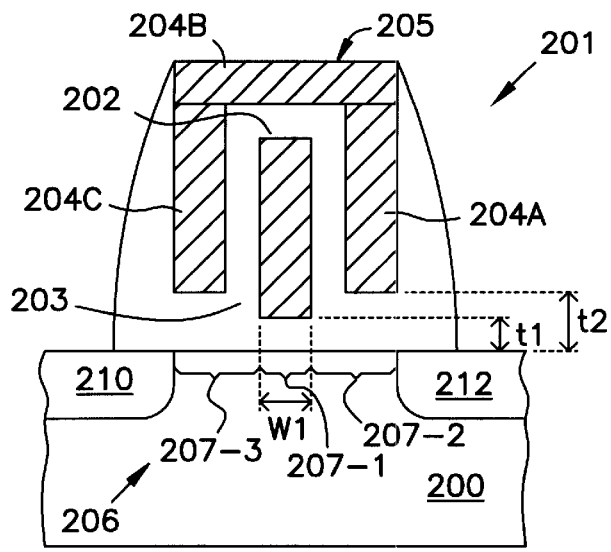
FIG. 2A is a block diagram of an embodiment for a novel memory cell, transistor, or floating gate transistor formed according to the teachings of the present invention.

FIG. 2A is a block diagram of an embodiment for a novel memory cell, transistor, or floating gate transistor 201 formed according to the teachings of the present invention. As shown in FIG. 2A, the memory cell 201 includes a source region 210 and a drain region 212 separated by a channel region 206 in a horizontal substrate 200. According to the teachings of the embodiment shown in FIG. 2A, the memory cell 201 includes a first vertical gate 202 located above a first portion, or first region, 207-1, of the channel region 206. In one embodiment, the first vertical gate 202 includes or serves as a floating gate 202 for the memory cell 201. In an alternative embodiment, the first vertical gate 202 includes or serves as a control gate 202 for memory cell 201. The first vertical gate is separated from the channel region 206 by a first thickness insulator material, or first oxide thickness (t1). A second vertical gate 204A is located above a second portion, or second region, 207-2 of the channel region 206. The second vertical gate 204A is separated from the channel region 206 by a second thickness insulator material, or second oxide thickness (t2). The memory cell 201 embodiment shown in FIG. 2A further includes a third vertical gate 204C located above a third portion, or third region, 207-3 of the channel region 206. The third vertical gate is separated from the channel region 206 by the second thickness insulator material, or second oxide thickness (t2). In one embodiment of the present invention, the first oxide thickness (t1) is approximately 60 Angstroms (Å) and the second oxide thickness (t2) is approximately 100 Angstroms (Å). According to the teachings of the present invention, the first thickness insulator material (t1) and the second thickness insulator material (t2) are formed of silicon dioxide ($SiO_2$).

As shown in the embodiment of FIG. 2A, the second and the third vertical gates, 204A and 204C respectively, are parallel to and on opposing sides of the first vertical gate 202 forming a symmetrical structure. The memory cell 201 embodiment of FIG. 2A further includes a horizontal gate member 204B which couples the second 204A and the third 204C vertical gates. The horizontal gate member 204B is located above the first vertical gate 202 and separated therefrom by an intergate dielectric 203. In the embodiment shown in FIG. 2A, the second and the third portion, 207-2 and 207-3 respectively, of the channel region 206 are adjacent to the source region 210 and the drain region 212 respectively.

According to one embodiment of the present invention, the first vertical gate 202, the second vertical gate 204A, the horizontal gate member 204B, and the third vertical gate 204C include polysilicon gates which are separated from one another by the intergate dielectric 203. According to the teachings of the present invention, the intergate dielectric includes an intergate dielectric formed from silicon dioxide ($SiO_2$). In one embodiment, the intergate dielectric 203 between the first vertical gate 202, the second vertical gate 204A, the horizontal gate member 204B, and the third vertical gate 204C has a thickness approximately equal to the first oxide thickness (t1), or first thickness insulator material. In one embodiment of the present invention, the first vertical gate 202, the second vertical gate 204A, and the third vertical gate 204C each have a horizontal width w1 of approximately 100 nanometers (nm).

As described above, in one embodiment, the first vertical gate 202 in memory cell 201 serves as a floating gate 202. In this embodiment, the second vertical gate 204A, the horizontal gate member 204B, and the third vertical gate 204C serve as control gates. In an alternative embodiment, the first vertical gate 202 in memory cell 201 serves as a control gate for the memory cell 201. In this embodiment, the second vertical gate 204A, the horizontal gate member 204B, and the third vertical gate 204C serve as floating gates. In one embodiment, the first vertical gate 202, the second vertical gate 204A, and the third vertical gate 204C have a vertical height, respectively, of approximately 500 nanometers (nm).

Figure 2B:
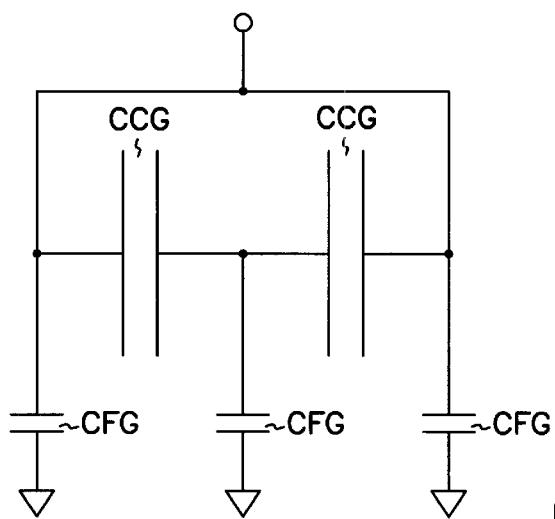
FIG. 2B is a schematic diagram illustrating the respective capacitances between the between respective components of the novel memory cell shown in FIG. 2A.
Figure 2C:
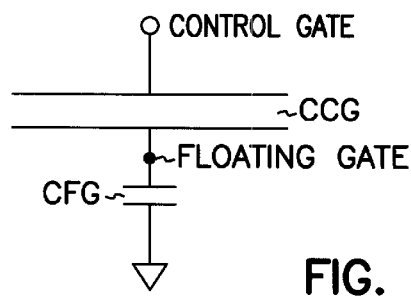
FIG. 2C is a simplified schematic diagram representing the same capacitance relationship shown in FIG. 2B.

FIG. 2B is a schematic diagram illustrating the respective capacitances between the between the first vertical gate 202, the second vertical gate 204A, the horizontal gate member 204B, and the third vertical gate 204C, e.g. the control gate capacitance (CCG), as well as between these vertical gates and the channel region 206, e.g. the floating gate capacitance (CFG). FIG. 2C is a simplified schematic diagram representing the same capacitance relationship. Thus, according to the teachings of the present invention, a greater percentage of a voltage applied to the control gate appears between the floating gate and the channel than between the control gate and the floating gate. This is true, since as shown in FIGS. 2B and 2C, the floating gate capacitance (CFG) of the present invention is much smaller than the control gate capacitance (CCG).

According to the teachings of the present invention, the total capacitance of these memory devices is about the same as that for the prior art of comparable source and drain spacings. However, according to the teachings of the present invention, the floating gate capacitance is much smaller than the control gate capacitance such that the majority of any voltage applied to the control gate will appear across the floating gate thin tunnel oxide. Thus, the devices of the present invention can be programmed by tunneling of electrons to and from the silicon substrate at lower control gate voltages than is possible in the prior art.

Figure 3A:
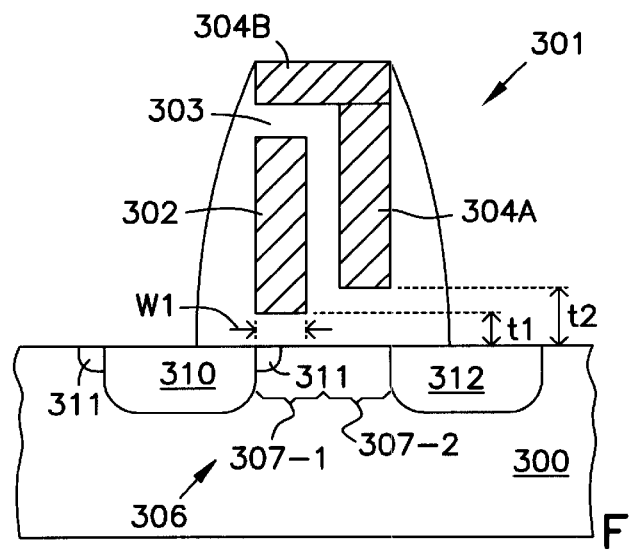
FIG. 3A is a block diagram of another, asymmetrical embodiment for a novel memory cell, transistor, or floating gate transistor formed according to the teachings of the present invention.

FIG. 3A is a block diagram of another, asymmetrical embodiment for a novel memory cell, transistor, or floating gate transistor 301 formed according to the teachings of the present invention. As shown in FIG. 3A, the memory cell 301 includes a source region 310 and a drain region 312 separated by a channel region 306 in a horizontal substrate 300. According to the teachings of the embodiment shown in FIG. 3A, the memory cell 301 includes a first vertical gate 302 located above a first portion, or first region, 307-1, of the channel region 306. In one embodiment, the first vertical gate 302 includes or serves as a vertical floating gate 302 for the memory cell 301. In an alternative embodiment, the first vertical gate 302 includes or serves as a vertical control gate 302 for memory cell 301. The first vertical gate is separated from the channel region 306 by a first thickness insulator material, or first oxide thickness (t1). A second vertical gate 304A is located above a second portion, or second region, 307-2 of the channel region 306. The second vertical gate 304A is parallel to and opposes the first vertical gate 302 and is separated therefrom by an intergate dielectric 303. The second vertical gate 304A is separated from the channel region 306 by a second thickness insulator material, or second oxide thickness (t2). According to the teachings of the present invention, the first thickness insulator material (t1) and the second thickness insulator material (t2) are formed of silicon dioxide ($SiO_2$). In one embodiment, the first thickness insulator material (t1) is approximately 60 Angstroms (Å), and wherein the second thickness insulator material (t2) is approximately 100 Angstroms (Å).

According to one embodiment of the present invention, the second vertical gate 304A includes a horizontal gate member 304B which couples to the second vertical gate 304A and is separated from the first vertical gate by the intergate dielectric 303. As shown in FIG. 3A, the horizontal member 304B is located above a portion of the first vertical gate 302. According to the teachings of the present invention, the intergate dielectric includes an intergate dielectric formed from silicon dioxide ($SiO_2$). In one embodiment, the intergate dielectric 303 between the first vertical gate 302, the second vertical gate 304A, and the horizontal gate member 304B has a thickness approximately equal to the first oxide thickness (t1), or first thickness insulator material. In one embodiment of the present invention, the first vertical gate 302 and the second vertical gate 304A each have a horizontal width w1 of approximately 100 nanometers (nm). In one embodiment, the first vertical gate 302 and the second vertical gate 304A respectively each have a vertical height of approximately 500 nanometers (nm).

As shown in FIG. 3A, the first vertical gate 302 which is separated from a first portion 307-1 of the channel region is separated from a first portion 307-1 of the channel region 306 which includes a portion of the channel region 306 adjacent to the source region 310. The second vertical gate 304A which is separated from a second portion 307-2 of the channel region 306 is separated from a second portion 307-2 of the channel region which includes a portion of the channel region 306 adjacent to the drain region 312. As one of ordinary skill in the art will understand upon reading this disclosure, the relationship of the structure shown in FIG. 3A to the source and drain regions, 310 and 312 respectively, can be reversed. As shown in FIG. 3A, in one embodiment of the present invention, source and/or drain region extension, such as source extension 311, are included in memory cell 301. As will be understood by one of ordinary skill in the art upon reading this disclosure, the same can apply to the memory cell structure shown in FIG. 2A.

Figure 3B:
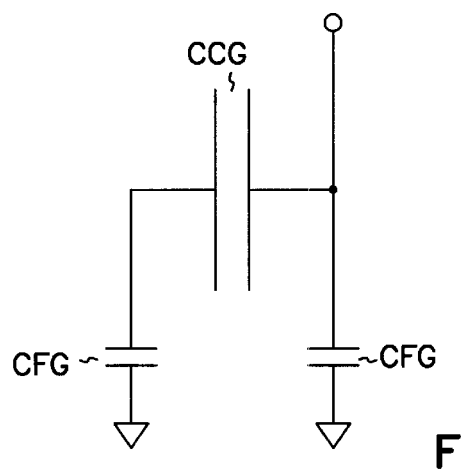
FIG. 3B is a schematic diagram illustrating the respective capacitances between the between respective components of the novel memory cell shown in FIG. 3A.
Figure 3C:
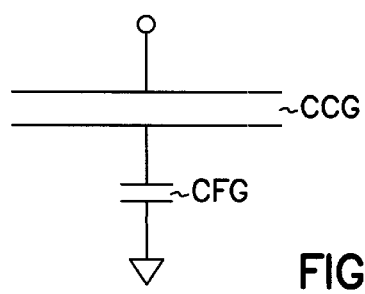
FIG. 3C is a simplified schematic diagram representing the same capacitance relationship shown in FIG. 3B.

FIG. 3B is a schematic diagram illustrating the respective capacitances between the between the first vertical gate 302, the second vertical gate 304A, and the horizontal gate member 304B, e.g. the control gate capacitance (CCG), as well as between these vertical gates and the channel region 306, e.g. the floating gate capacitance (CFG). FIG. 3C is a simplified schematic diagram representing the same capacitance relationship. Thus, according to the teachings of the present invention, a greater percentage of a voltage applied to the control gate appears between the floating gate and the channel than between the control gate and the floating gate. This is true, since as shown in FIGS. 3B and 3C, the floating gate capacitance (CFG) of the present invention is much smaller than the control gate capacitance (CCG). In other words, a capacitance between the vertical control gate 304A and the floating gate 302 (CCG) is greater than a capacitance between the floating gate 302 and the channel 306 (CFG).

Hence again, according to the teachings of the present invention, the total capacitance of these memory devices is about the same as that for the prior art of comparable source and drain spacings. However, according to the teachings of the present invention, the floating gate capacitance is much smaller than the control gate capacitance such that the majority of any voltage applied to the control gate will appear across the floating gate thin tunnel oxide. Thus, the devices of the present invention can be programmed by tunneling of electrons to and from the silicon substrate at lower control gate voltages than is possible in the prior art.

FIGS. 4A–4I are useful in illustrating the methods of forming a novel memory cell, transistor or floating gate transistor according to the teachings of the present invention. According to the teachings of the present invention an edge-defined poly-silicon vertical gate is defined over the thin gate oxide in the active device area. This vertical gate is re-oxidized and another poly-silicon layer is deposited over the structure, and anisotropically or directionally etched to define another polysilicon vertical gate. These can be either symmetrical gate structures as shown and described in connection with FIG. 2A or asymmetrical gate structures as shown and described in connection with FIG. 3A. The methods of the present invention result in a novel memory cell which has a larger capacitance between the control gate and the floating gate, and only a smaller capacitance between the floating gate and the substrate. Thus, according to the teachings of the present invention, smaller control gate voltages than are required by conventional memory devices will result in large potential differences between the floating gate and substrate. This is due to the fact that the capacitance ratio as illustrated in FIGS. 2B, 2C, 3B, and 3C is more advantageous in the novel memory cell embodiments of the present invention.

Figure 4A:
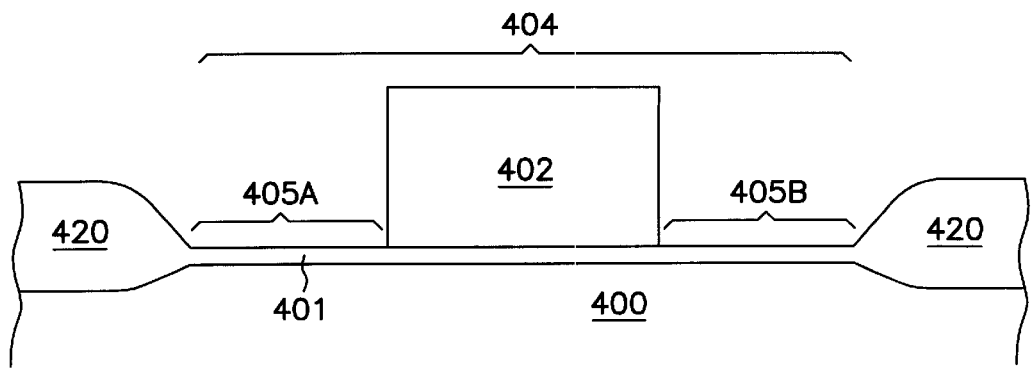
FIGS. 4A–4I illustrate embodiments of the methods for forming the novel memory cell, transistor or floating gate transistor according to the teachings of the present invention.

FIG. 4A illustrates the structure after the first sequence of processing steps. In FIG. 4A, a thin gate oxide 401 is formed over an active device area 404, between a pair of field isolation oxides (FOXs) 420, in a horizontal surface of a substrate 400. The thin gate oxide 401 is formed to a first oxide thickness (t1). In one embodiment, the thin gate oxide 401 is formed to a thickness (t1) of approximately 60 Angstroms (Å). One of ordinary skill in the art will understand upon reading this disclosure the various suitable manners in which a thin gate oxide 401 can be formed over the active device area 403. For example, in one embodiment, the thin gate oxide can be formed by thermal oxidation, and the FOXs can be formed using local oxidation of silicon (LOCOS) as the same are known and understood by one of ordinary skill in the art. After growth of the thin gate oxide 401 by thermal oxidation, and the LOCOS isolation 420, a thick layer of sacrificial oxide 402 is deposited over the surface of the thin gate oxide 401. In one embodiment, the thick layer of sacrificial oxide 402 is deposited to a thickness of approximately 0.5 micrometers ($\mu$m) using a low-pressure chemical vapor deposition (LPCVD) technique. Using a photoresist mask, according to photolithography techniques which are known and understood by one of ordinary skill in the art, this thick oxide 402 is etched while protecting the desired thin-oxide 401 in device areas 405A and 405B. According to one embodiment of the present invention, an inductively coupled plasma reactor (ICP) using $CHF_3$ may be employed for this etching as the same is disclosed in an article by N. R. Rueger et al., entitled "Selective etching of $SiO_2$ over polycrystalline silicon using $CHF_3$ in an inductively couples plasma reactor", J. Vac. Sci. Technol., A, 17(5), p. 2492–2502, 1999. Alternatively, a magnetic neutral loop discharge plasma can be used to etch the thick oxide 402 as disclosed in an article by W. Chen et al., entitled "Very uniform and high aspect ratio anisotropy $SiO_2$ etching process in magnetic neutral loop discharge plasma", ibid, p. 2546–2550. The latter is known to increase the selectivity of $SiO_2$ to photoresist and/or silicon. The structure is now as appears in FIG. 4A.

Figure 4B:
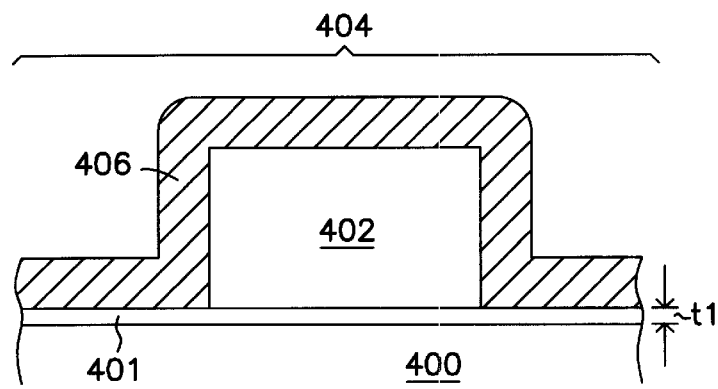

FIG. 4B illustrates the structure following the next sequence of fabrication steps. In FIG. 4B, a polysilicon layer 406 is deposited to a thickness of approximately 200 nanometers (nm). A conventional chemical vapor deposition (CVD) reactor may be used to deposit polycrystalline silicon films at substrate temperature in excess of 650° Celsius (C.). In an alternative embodiment, a plasma-enhanced CVD process (PECVD) can be employed if a lower thermal budget is desired. In another alternative embodiment, a microwave-excited plasma enhanced CVD of poly-silicon using $SiH_4$/Xe at temperature as low as 300° C. can be performed to deposit the polysilicon layer 406 as disclosed by Shindo et al., ibid. p. 3134–3138. According to this process embodiment, the resulting grain size of the poly-silicon film was measured to be approximately 25 nm. Shindo et al. claim that the low-energy (approximately 3 ev), high-flux, ion bombardment utilizing Xe ions on a growing film surface activates the film surface and successfully enhances the surface reaction/migration of silicon, resulting in high quality film formation at low temperatures. In another alternative embodiment, the polysilicon layer 406 can be formed at an even lower temperature, e.g. 150° C., with and without charged species in an electron cyclotron resonance (ECR) plasma-enhanced CVD reactor as disclosed in an article by R. Nozawa et al., entitled "Low temperature polycrystalline silicon film formation with and without charged species in an electron cyclotron resonance $SiH_4$ plasma-enhanced chemical vapor deposition", ibid, p. 2542–2545. In this article, R. Nozawa et al. describe that in using an atomic force microscope they found that the films formed without charged species were smoother than those films formed with charged species. According to the teachings of the present invention, it is important to keep the smoothness of polysilicon layer 406. This will be evident from reading the subsequently described process steps in which another polysilicon layer will be fabricated later onto polysilicon layer 406 with a very thin insulation layer between them. The structure is now as appears in FIG. 4B.

Figure 4C:
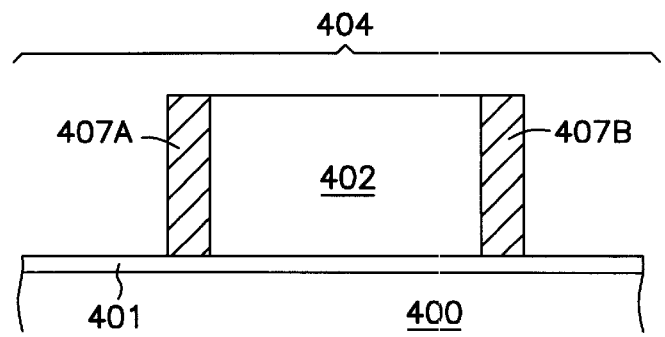

FIG. 4C illustrates the structure following the next sequence of processing steps. FIG. 4C shows a cross section of the resulting vertical gate structures, 407A and 407B, over the active device area 404 after the polysilicon layer 406 has been anisotropically etched. As shown in FIG. 4C, the polysilicon vertical gate structures, 407A and 407B, remain only at the sidewalls of the thick sacrificial oxide 402. In one embodiment, the polysilicon layer 406 is anisotropically etched such that the vertical gate structures, 407A and 407B remaining at the sidewalls of the thick sacrificial oxide 402 have a horizontal width w1 of approximately 100 nanometers (nm). In one embodiment, the polysilicon layer 406 can be anisotropically etched to form the vertical gate structures, 407A and 407B, through the use of a high-density plasma helicon source for anisotropic etching of a dual-layer stack of poly-silicon on $Si_{1-x}Ge_xS$. as described in an article by Vallon et al., entitled "Poly-silicon-germanium gate patterning studies in a high density plasma helicon source", J. Vac. Sci. technol., A, 15(4), p. 1874–80, 1997. The same is incorporated herein by reference. In this article, wafers were described as being etched in a low pressure, high density plasma helicon source using various gas mixtures of $Cl_2$, HBr, and $O_2$. Also, according to this article, process conditions were optimized to minimize the gate oxide 401 consumption. The structure is now as shown in FIG. 4C.

Figure 4D:
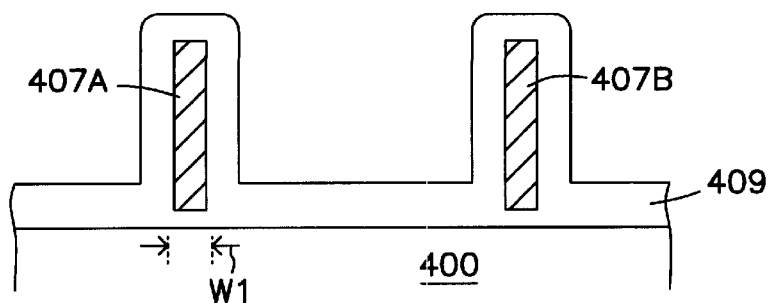

FIG. 4D illustrates the structure after the next series of process steps. In FIG. 4D, the thick sacrificial oxide 402 is removed. As one of ordinary skill in the art will understand upon reading this disclosure the thick sacrificial oxide layer can be removed using any suitable, oxide selective etching technique. As shown in FIG. 4D, the remaining polysilicon vertical gate structures, 407A and 407B, are oxidized to form insulator, intergate dielectric, oxide layer, or silicon dioxide ($SiO_2$) layer 409. In one embodiment, a conventional thermal oxidation of silicon may be utilized at a high temperature, e.g. greater than 900° C. In an alternative embodiment, for purposes of maintaining a low thermal budget for advanced ULSI technology, a lower temperature process can be used. One such low temperature process includes the formation of high-quality silicon dioxide films by electron cyclotron resonance (ECR) plasma oxidation at temperature as low as 400° C. as described in an article by Landheer, D. et al., entitled "Formation of high-quality silicon dioxide films by electron cyclotron resonance plasma oxidation and plasma-enhanced chemical vapor deposition", Thin Solid Films, vol. 293, no. 1–2, p. 52–62, 1997. The same is incorporated herein by reference. Another such low temperature process includes a low temperature oxidation method using a hollow cathode enhanced plasma oxidation system as described in an article by Usami, K. et al., entitled "Thin Si oxide films for MIS tunnel emitter by hollow cathode enhanced plasma oxidation", Thin Solid Films, vol. 281–282, no. 1–2, p. 412–414, 1996. The same is incorporated herein by reference. Yet another low temperature process includes a low temperature VUV enhanced growth of thin silicon dioxide films at low temperatures below 400° C. as described in an article by Patel, P. et al., entitled "Low temperature VUV enhanced growth of thin silicon dioxide films", Applied Surface Science, vol. 46, p. 352–6, 1990. The same is incorporated herein by reference.

Figure 4E:
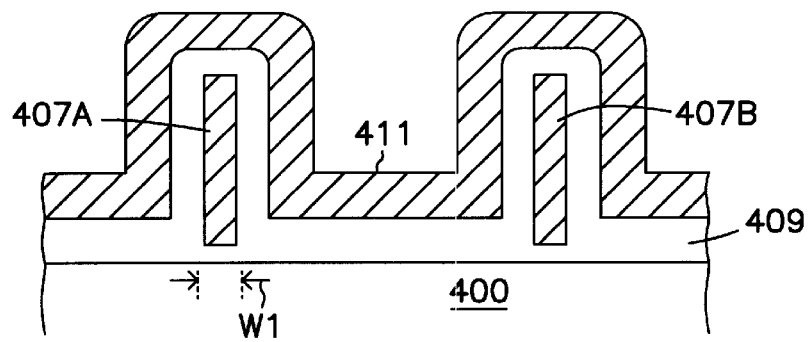

FIG. 4E shows the structure following the next series of steps. In FIG. 4E, another, or second, polysilicon layer 411 is formed over the oxide layer 409 to a thickness of approximately 100 nm. Forming the second polysilicon layer 411 over the oxide layer 409 can be performed using any similar technique to those used in forming the first polysilicon layer 406 as described in detail in connection with FIG. 4B. As shown in FIG. 4E, the second polysilicon layer 411 will be separated by a second oxide thickness, or second insulator thickness (t2) from the active device region 404 which is slightly greater than the thin tunnel oxide thickness, e.g. first oxide thickness or first insulator thickness (t1) which separates the vertical gate structures 407A and 407B from the active device region 404. In one embodiment the second oxide thickness, or second insulator material thickness (t2) is approximately 100 Angstroms (Å) thick. The structure is now as appears in FIG. 4E.

Figure 4F:
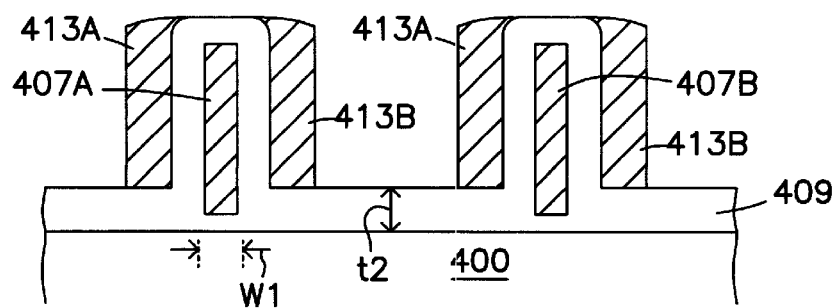

FIG. 4F illustrates the structure after the next series of steps. In FIG. 4F, the structure is once again subjected to an anisotropic etch. The anisotropic etch includes the anisotropic etching process used for etching the first polysilicon layer 406 to form the vertical gate structures 407A and 407B as described in more detail in connection with FIG. 4C. FIG. 4F shows one embodiment of the present invention in which the resulting structure is symmetrical, including two groups of three free standing vertical polysilicon gates. The two groups of three free standing vertical gates include the original vertical gate structures 407A and 407B, and new vertical gate structures 413A and 413B parallel to and on opposing sides of each original vertical gate structures 407A and 407B. This structure embodiment is now as appears in FIG. 4F.

Figure 4G:
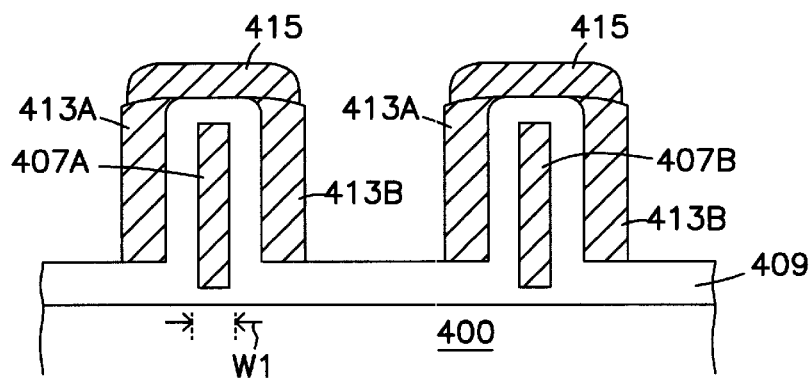

In FIG. 4G, the process is continued to form horizontal polysilicon gate structures above the original vertical gate structures 407A and 407B, and new vertical gate structures 413A and 413B on opposing sides of each original vertical gate structures 407A and 407B. In FIG. 4G, the new vertical gate structures 413A and 413B are connected by forming a third polysilicon layer 415 over a top surface of the structure shown in FIG. 4F. The third polysilicon layer 415 can be formed over the top surface of the structure shown in FIG. 4F using any similar technique to those used in forming the first polysilicon layer 406 as described in detail in connection with FIG. 4B. In one embodiment, according to the teachings of the present invention, the third polysilicon layer 415 is formed to a thickness of approximately 100 nm. In one embodiment, forming the third polysilicon layer 415 is followed by masking and etching techniques, as the same have been described above, in order to leave horizontal polysilicon gate structures 415 only above and connecting the vertical gate structures 413A and 413B. The structure is now as appears in FIG. 4G. FIG. 4G thus represent a symmetrical structure embodiment of the present invention in which the vertical gate structures 413A and 413B, which are parallel to and on opposing sides of each vertical gate structures 407A and 407B, are coupled by the horizontal polysilicon gate structures 415 above the vertical gate structures 407A and 407B. As shown in FIG. 4G, the vertical gate structures 413A and 413B coupled by the horizontal polysilicon gate structures 415 are isolated from vertical gate structures 407A and 407B by insulator layer or oxide layer 409.

In one embodiment, illustrated by FIG. 4H, the structure of FIG. 4G can be anisotropically etched using masking techniques known to one of ordinary skill in the art, as well as the anisotropic etching processes described in connection with FIG. 4F, to produce asymmetrical vertical gate structures. These asymmetrical vertical gate structures will include the original vertical gate structures 407A and 407B, and one remaining vertical gate structure, either 413A or 413B on one side or the other of each original vertical gate structures 407A and 407B as well as a horizontal gate structure 415 depending on the chosen condition of the anisotropic etch process. That is, the anisotropic etch can be performed to leave horizontal gate structure 415 coupled to and above either vertical gate structure 413A or 413B on one side or the other of each original vertical gate structures 407A and 407B. The same is shown in FIG. 4H.

Figure 4H:
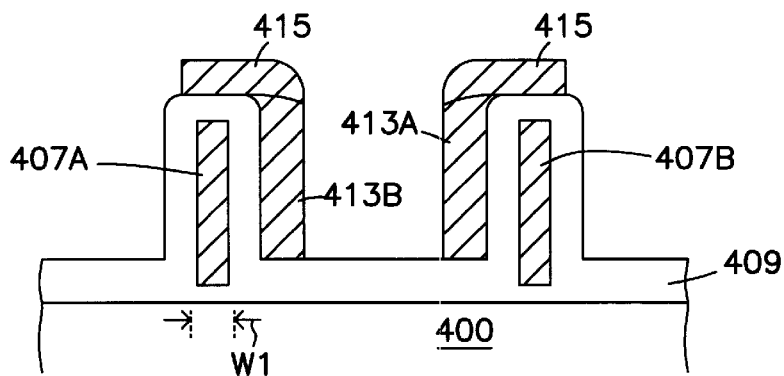
Figure 4I:
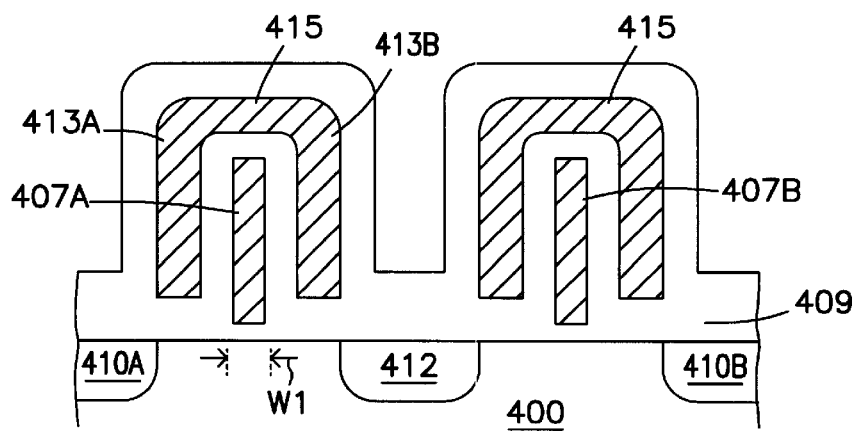

The next series of process steps can continue from either FIGS. 4G or 4H. For purposes of illustration, FIG. 4I provides an illustration of the process steps continued from FIG. 4G. However, one of ordinary skill in the art will understand that analogous process steps may be used to continue the fabrication process from the structure shown in FIG. 4H. In FIG. 4I, the structure from FIG. 4G is oxidized to form an oxide layer of approximately 50 nm. The oxidation process of the structure shown in FIG. 4G can be performed using any suitable technique as the same has been describe above. An ion implantation is then performed to activate source regions shown as 410A and 410B as well as drain region 412. In FIG. 4I, the drain region 412 is illustrated as shared between vertical gate structure 407A and 407B.

One of ordinary skill in the art will understand that other source and drain region configurations can be activated through various ion implantation techniques. Additionally, in one embodiment, the source and/or drain regions can be fabricated with source and/or drain extensions, e.g. similar to source extensions shown in connection with FIG. 3A for facilitating tunneling, by using a masking step and another implantation as the same is known and understood by one of ordinary skill in the art of memory technology. Further conventional process steps can then be used to contact the source, drain and control gate portions of the structure to complete the device of either FIG. 2A or FIG. 3A.

As described above, the structures can be completed such that vertical gates 407A and 407B serve as floating gates for the device structures and vertical gates 413A and 413B serve as control gates. Alternatively, the structures can be completed such that vertical gates 407A and 407B serve as a control gate for the device structures and vertical gates 413A and 413B serve as floating gates.

Figure 1B:
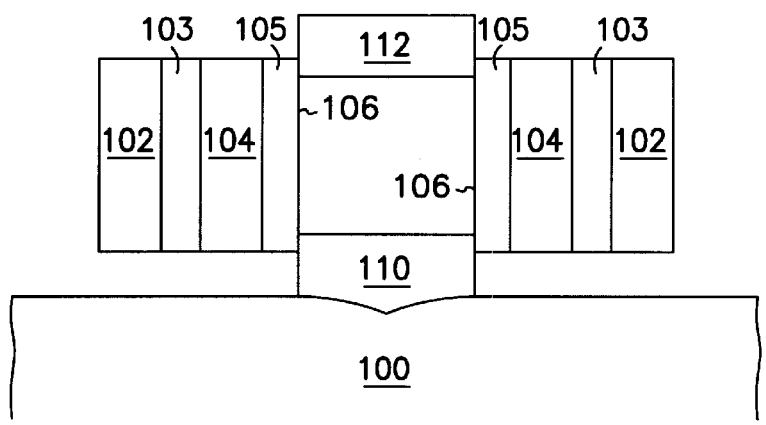
FIG. 1B is a block diagram of a vertical EEPROM, EAPROM, or flash memory device formed according to the teachings of the existing art.
Figure 1C:
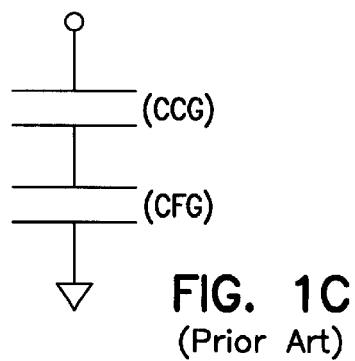
FIG. 1C is a schematic diagram illustrating the generally equivalent capacitances of the control gate (CCG) and the floating gate (CFG) according to the existing art.

As will be understood by reading this disclosure, the memory cells, or floating gate transistors, of the present invention can be fabricated such that the total capacitance of the device is about the same as that of prior art horizontal or vertical floating gate transistor structures, e.g. FIGS. 1A and 1B, of comparable source/drain spacings. However, now since the floating gate capacitance (CFG) for the novel memory cells of the present invention is much smaller than the control gate capacitance (CCG) the majority of any voltage applied to the control gate will appear across the floating gate thin tunnel oxide 401. The floating gate can then be programmed and erased by tunneling of electrons to and from the source of the transistor at relatively low voltages, or programmed by hot electron injection and erased by tunneling.

The operation of the novel memory cells of the present invention is illustrated in connection with FIGS. 5A–5E. As explained above, the novel device of the present invention will function on tunneling of electrons to and from the source region of the device for both writing and erase operations, or operate in a tunnel-tunnel mode in conjunction with hot electron injection.

Figure 5A:
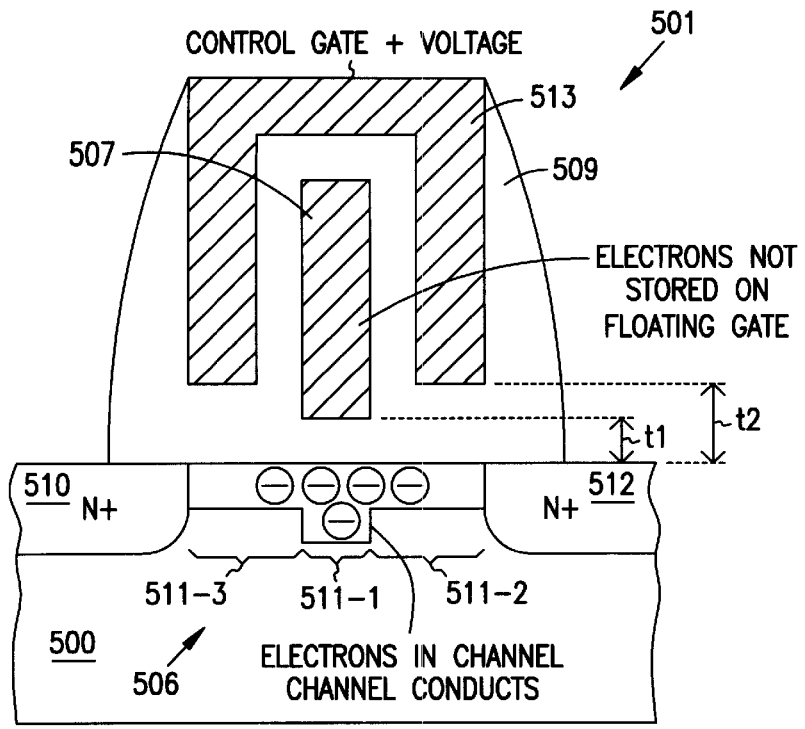
FIGS. 5A–5E are block diagrams illustrating embodiments of the methods or operating the novel memory cells of the present invention.
Figure 5B:
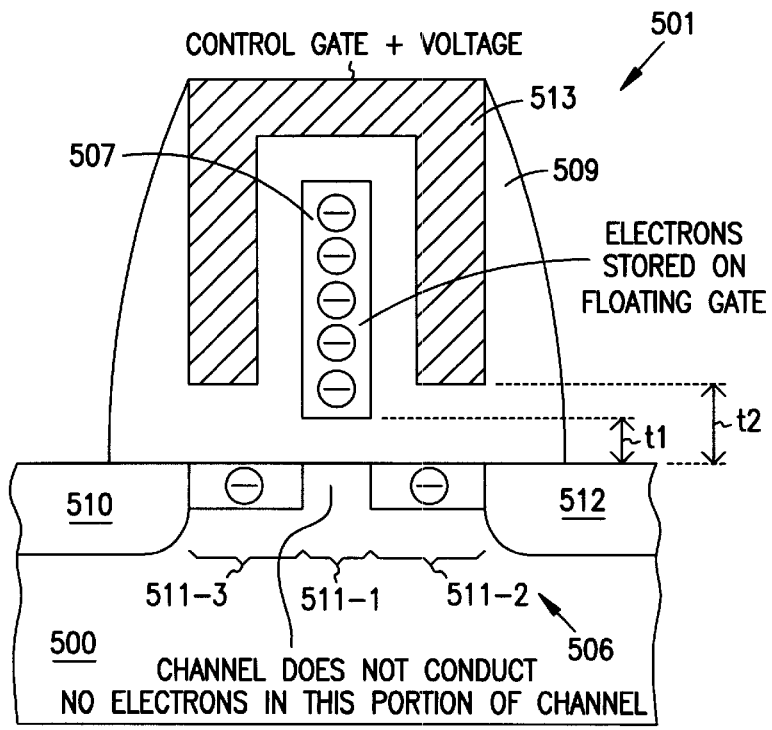

FIGS. 5A–5B illustrate the operation of the novel memory cell of FIG. 2A when the outer vertical gates serve as the control gate. In this embodiment, the novel device 501 of the present invention will function on tunneling of electrons to and from the source region 510 of the device 501 for both writing and erase operations as the same are known and understood by one of ordinary skill in the art. As shown in FIG. 5A, if no electrons are stored on the floating gate 507, then when a potential is applied to the control gate 513, the region of the channel 511-1 beneath the floating gate 507 will actually have a slightly lower threshold voltage (Vt) than the other regions of the channel where the slightly thicker gate oxides (t2) separate the control gate 513 from the channel 506, and the transistor will readily turn on, at lower than conventional control gate voltages, when a read voltage is applied to the control gate 513. In this respect the device functions in a manner analogous to a flash memory cell. On the other hand, as shown in FIG. 5B, if electrons are stored on the floating gate 507, this region of the channel 511-1 beneath the floating gate 507 will have a high threshold voltage (Vt) and will not turn on and conduct when the same low voltage is applied to the control gate 513 to read the memory cell. There are simply no electrons in this region of the channel 511-1 beneath the floating gate 507 to conduct.

Figure 5C:
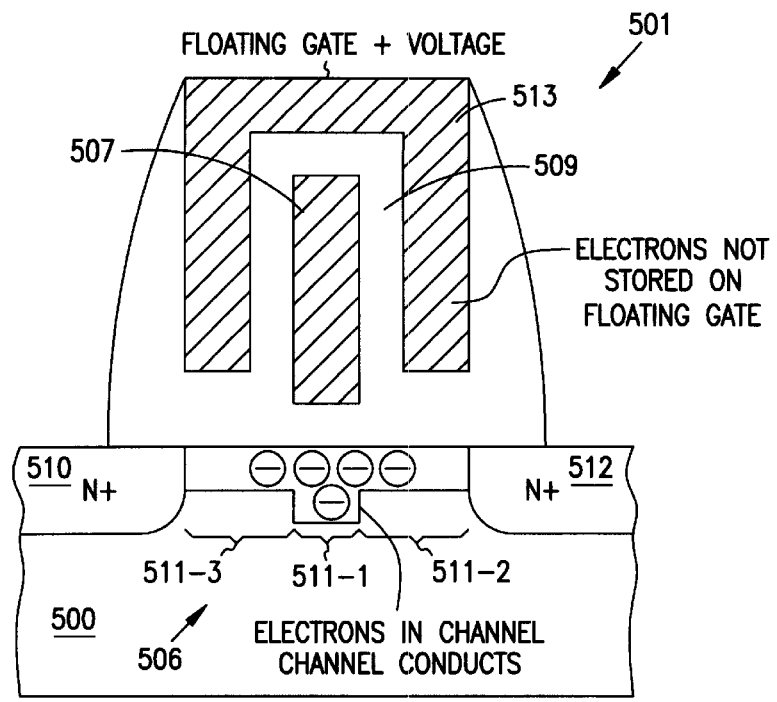
Figure 5D:
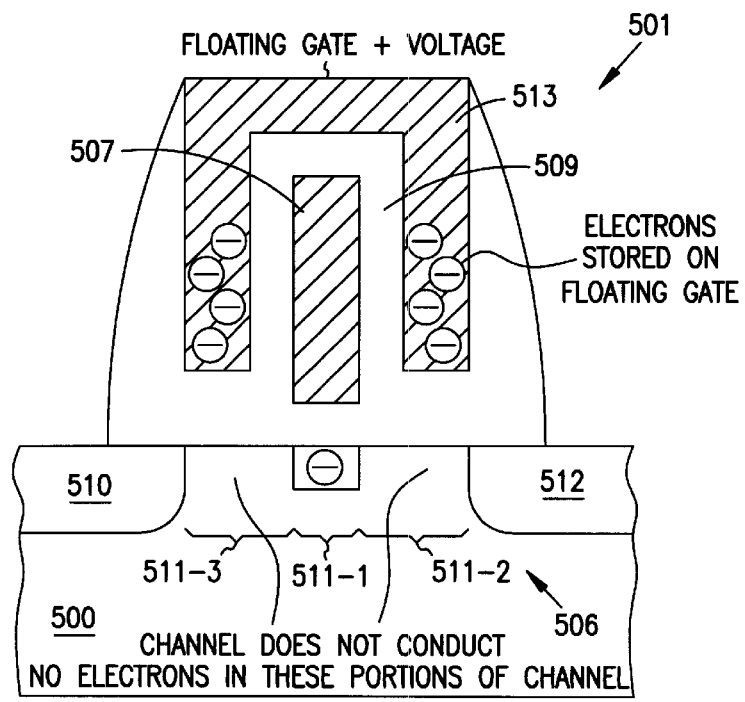

An alternative embodiment is to interchange the functions of the gates, the inner gate 507 becoming the control gate 507 and the outer gate 513 becoming the floating gate 513 as shown in FIGS. 5C–5D. In this embodiment, as shown in FIG. 5C, again with no electrons stored on the floating gate 513, when a potential is applied to the control gate 507, the region of the channel beneath 511-1 the control gate 507 will actually have a slightly lower threshold voltage (Vt) than the other regions of the channel where the slightly thicker gate oxides (t2) separate the floating gate 513 from the channel 506, and the transistor will readily turn on at lower than conventional control gate 507 voltages, when a read voltage is applied to the control gate 507. On the other hand, as shown in FIG. 5D, if electrons are stored on the floating gate 513, the other regions of the channel where the slightly thicker gate oxides (t2) separate the floating gate 513 from the channel 506 will have a high threshold voltage (Vt) and will not turn on and conduct when the same low voltage is applied to the control gate 507 to read the memory cell. There are simply no electrons in these other regions of the channel, e.g. regions 511-2 and 511-3 where the slightly thicker gate oxides (t2) separate the floating gate 513 from the channel 506, to conduct.

Figure 5E:
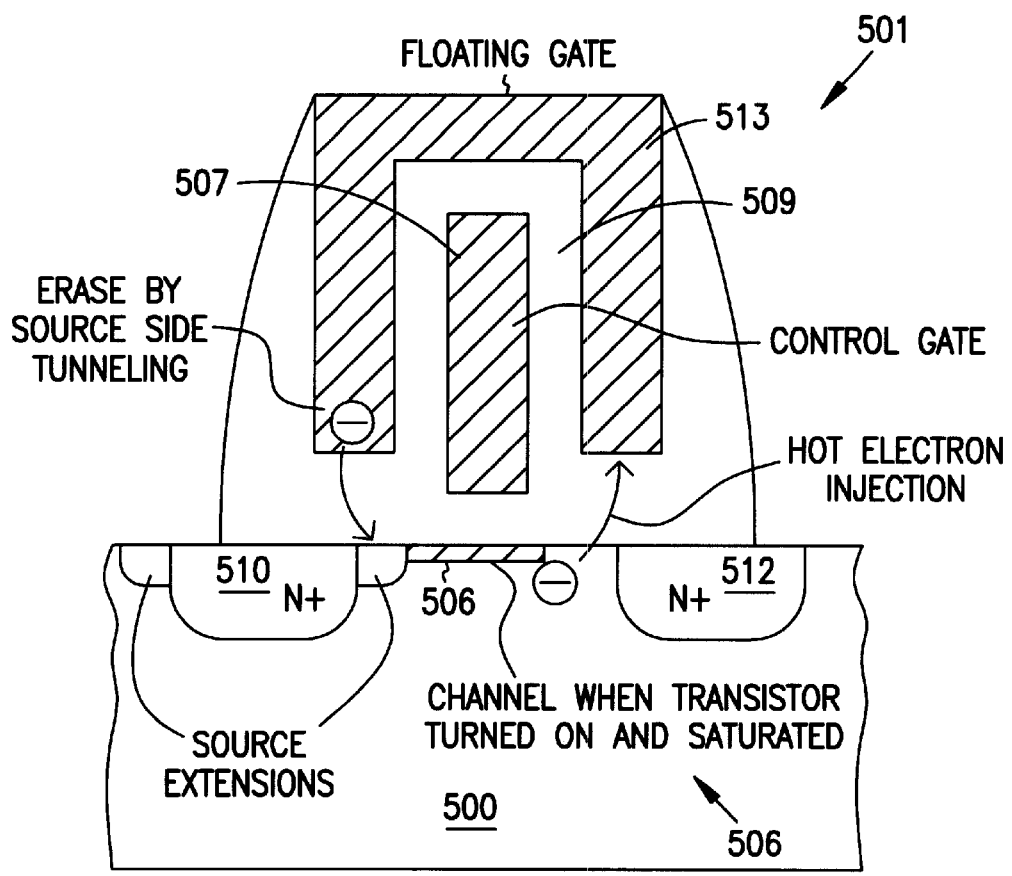

As shown in FIG. 5E, in this later embodiment of FIGS. 5C–5D, the erase operation will be performed using source side 510 tunneling. The write operation, however, will use hot electron injection at the drain region 512 to write electrons on to the floating gate 513 as is commonly done in some flash memory cells. As one of ordinary skill will understand upon reading this disclosure, similar operation modes can be employed based on the particular floating gate to control gate configuration selection for the structure embodiment shown in FIG. 3A.

Figure 6A:
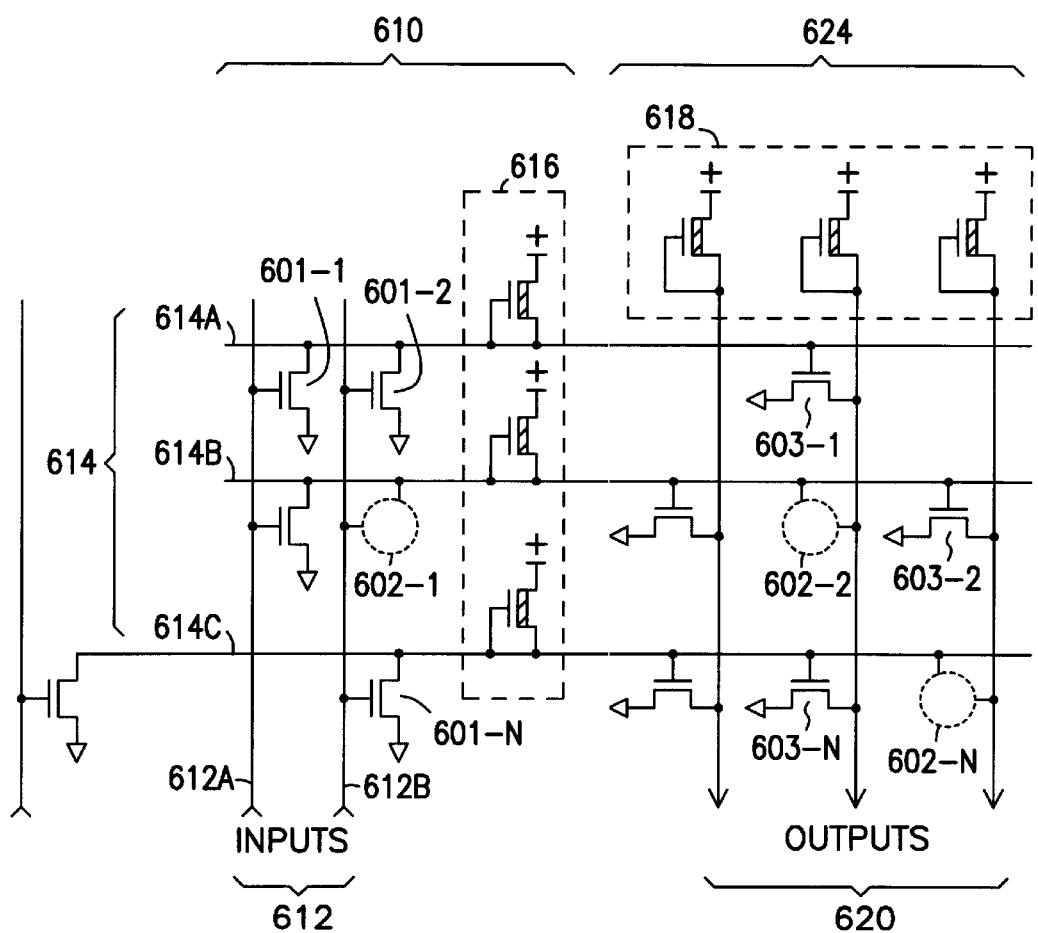
FIG. 6A is a schematic diagram illustrating a conventional NOR-NOR programmable logic array.

FIG. 6A shows a conventional NOR-NOR logic array 600 which is programmable at the gate mask level by either fabricating a thin oxide gate transistor, e.g. logic cells 601-1, 601-2, . . . , 601-N and 603-1, 603-2, . . . , 603-N, at the intersection of lines in the array or not fabricating a thin oxide gate transistor, e.g. missing thin oxide transistors, 602-1, 602-2, . . . , 602-N, at such an intersection. As one of ordinary skill in the art will understand upon reading this disclosure, the same technique is conventionally used to form other types of logic arrays not shown. As shown in FIG. 6A, a number of depletion mode NMOS transistors, 616 and 618 respectively, are used as load devices.

The conventional logic array shown in FIG. 6A includes a first logic plane 610 which receives a number of input signals at input lines 612. In this example, no inverters are provided for generating complements of the input signals. However, first logic plane 610 can include inverters to produce the complementary signals when needed in a specific application.

First logic plane 610 includes a number of thin oxide gate transistors, e.g. transistors 601-1, 601-2, . . . , 601-N. The thin oxide gate transistors, 601-1, 601-2, . . . , 601-N, are located at the intersection of input lines 612, and interconnect lines 614. In the conventional PLA of FIG. 6A, this selective fabrication of thin oxide gate transistor, e.g. transistors 601-1, 601-2, . . . , 601-N, is referred to as programming since the logical function implemented by the programmable logic array is entered into the array by the selective arrangement of the thin oxide gate transistors, or logic cells, 601-1, 601-2, . . . , 601-N, at the intersections of input lines 612, and interconnect lines 614 in the array.

In this embodiment, each of the interconnect lines 614 acts as a NOR gate for the input lines 612 that are connected to the interconnect lines 614 through the thin oxide gate transistors, 601-1, 601-2, . . . , 601-N, of the array. For example, interconnection line 614A acts as a NOR gate for the signals on input lines 612A and 612B. That is, interconnect line 614A is maintained at a high potential unless one or more of the thin oxide gate transistors, 601-1, 601-2, . . . , 601-N, that are coupled to interconnect line 614A are turned on by a high logic level signal on one of the input lines 612. When a control gate address is activated, through input lines 612, each thin oxide gate transistor, e.g. transistors 601-1, 601-2, . . . , 601-N, conducts which performs the NOR positive logic circuit function, an inversion of the OR circuit function results from inversion of data onto the interconnect lines 614 through the thin oxide gate transistors, 601-1, 601-2, . . . , 601-N, of the array.

As shown in FIG. 6A, a second logic plane 624 is provided which includes a number of thin oxide gate transistor, e.g. transistors 603-1, 603-2, . . . , 603-N. The thin oxide gate transistors, 603-1, 603-2, . . . , 603-N, are located at the intersection of interconnect lines 614, and output lines 620. Here again, the logical function of the second logic plane 624 is implemented by the selective arrangement of the thin oxide gate transistors, 603-1, 603-2, . . . , 603-N, at the intersections of interconnect lines 614, and output lines 620 in the second logic plane 624. The second logic plane 624 is also configured such that the output lines 620 comprise a logical NOR function of the signals from the interconnection lines 614 that are coupled to particular output lines 620 through the thin oxide gate transistors, 603-1, 603-2, . . . , 603-N, of the second logic plane 624. Thus, in FIG. 6A, the incoming signals on each line are used to drive the gates of transistors in the NOR logic array as the same is known by one of ordinary skill in the art and will be understood by reading this disclosure.

Figure 6B:
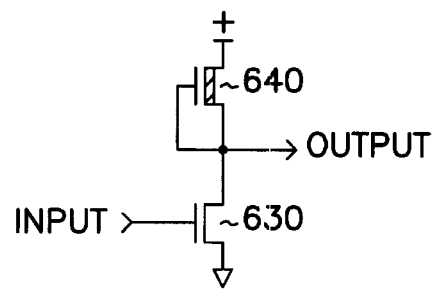
FIG. 6B, illustrates in more detail that the transistors used in FIG. 3A are enhancement mode NMOS transistors with a depletion mode NMOS load technology according to the teachings of the prior art.

As shown in FIG. 6B, the transistors used in FIG. 6A are NMOS transistors 630 with a depletion mode NMOS load technology 640. The load device or NMOS load transistor 640 is a depletion mode or normally "on" transistor which is saturated during the pull up switching transient thus providing high switching speed. The driver transistor 630 is an enhancement mode NMOS transistor 630 which is normally "off" with zero gate bias. All voltages are positive in a simple NMOS circuit.

Figure 7:
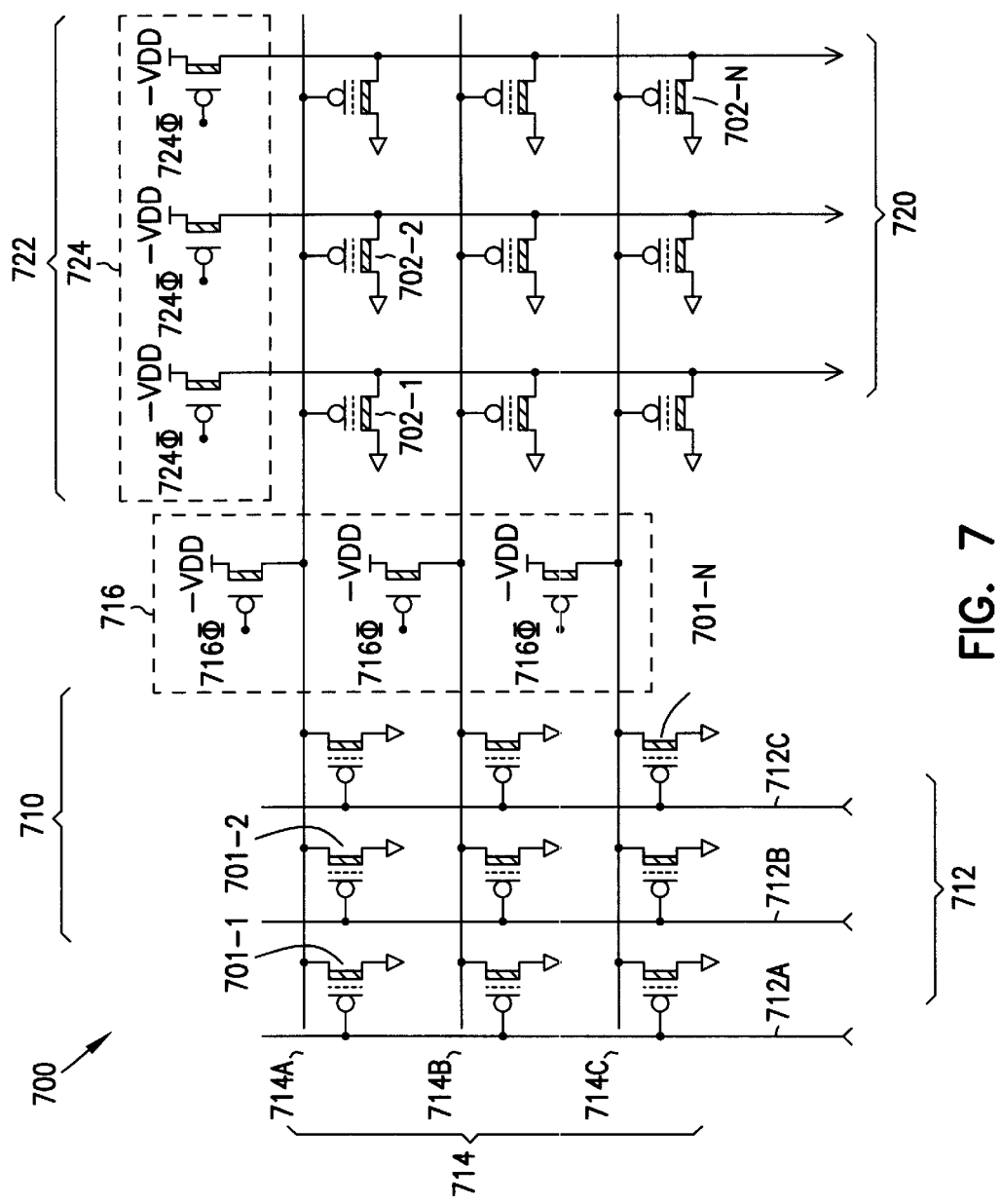
FIG. 7 is a schematic diagram illustrating generally an architecture of one embodiment of a novel programmable logic array (PLA) with floating gate transistors, or logic cells, according to the teachings of the present invention.

FIG. 7 illustrates an embodiment of a novel field programmable logic array (FPLA) formed according to the teachings of the present invention. In FIG. 7, PLA 700 implements an illustrative logical function using a two level logic approach. Specifically, FPLA 700 includes first and second logic planes 710 and 722. In this example, the logic function is implemented using NOR-NOR logic. As shown in FIG. 7, first and second logic planes 710 and 722 each include an array of, logic cells, or floating gate driver transistors, 701-1, 701-2, . . . , 701-N, and 702-1, 702-2, . . . , 702-N respectively, having their source regions coupled to ground, as shown and described in more detail in connection with FIGS. 2A and 3A. FIGS. 5A–5E describes the operation of these floating gate transistors. These floating gate driver transistors, 701-1, 701-2, . . . , 701-N, and 702-1, 702-2, . . . , 702-N are configured to implement the logical function of FPLA 700. Also, as shown in FIG. 7, a number of p-channel metal oxide semiconductor (PMOS) transistors are provided as load device transistors, 716 and 724 respectively, having their drain regions coupled to a voltage potential (VDD). These load device transistors, 716 and 724 respectively, operate in complement to the floating gate driver transistors, 701-1, 701-2, . . . , 701-N, and 702-1, 702-2, . . . , 702-N to form load inverters.

It is noted that the configuration of FIG. 7 is provided by way of example and not by way of limitation. Specifically, the teachings of the present application are not limited to programmable logic arrays in the NOR-NOR approach. Further, the teachings of the present application are not limited to the specific logical function shown in FIG. 7. Other logical functions can be implemented in a programmable logic array, with the floating gate driver transistors, 701-1, 701-2, . . . , 701-N, and 702-1, 702-2, . . . , 702-N and load device transistors, 716 and 724 respectively, of the present invention, using any one of the various two level logic approaches.

First logic plane 710 receives a number of input signals at input lines 712. In this example, no inverters are provided for generating complements of the input signals. However, first logic plane 710 can include inverters to produce the complementary signals when needed in a specific application.

First logic plane 710 includes a number of floating gate driver transistors, 701-1, 701-2, . . . , 701-N, that form an array. The floating gate driver transistors, 701-1, 701-2, . . . , 701-N, are located at the intersection of input lines 712, and interconnect lines 714. Not all of the floating gate driver transistors, 701-1, 701-2, . . . , 701-N, are operatively conductive in the first logic plane. Rather, the floating gate driver transistors, 701-1, 701-2, . . . , 701-N, are selectively programmed, as described in detail in FIGS. 5A–5E, to respond to the input lines 712 and change the potential of the interconnect lines 714 so as to implement a desired logic function. This selective interconnection is referred to as programming since the logical function implemented by the programmable logic array is entered into the array by the floating gate driver transistors, 701-1, 701-2, . . . , 701-N, that are used at the intersections of input lines 712, and interconnect lines 714 in the array.

In this embodiment, each of the interconnect lines 714 acts as a NOR gate for the input lines 712 that are connected to the interconnect lines 714 through the floating gate driver transistors, 701-1, 701-2, . . . , 701-N, of the array 700. For example, interconnection line 714A acts as a NOR gate for the signals on input lines 712A, 712B and 712C. Programmability of the vertical floating gate driver transistors, 701-1, 701-2, . . . , 701-N is achieved by charging the vertical floating gate. When the vertical floating gate is charged, that floating gate driver transistor, 701-1, 701-2, . . . , 701-N will remain in an off state until it is reprogrammed. Applying and removing a charge to the vertical floating gates is discussed in more detail in connection with FIGS. 5A–5E. A floating gate driver transistors, 701-1, 701-2, . . . , 701-N programmed in an off state remains in that state until the charge is removed from the vertical floating gate.

Floating gate driver transistors, 701-1, 701-2, . . . , 701-N not having a corresponding vertical floating gate charged operate in either an on state or an off state, wherein input signals received by the input lines 712A, 712B and 712C determine the applicable state. If any input lines 712A, 712B and 712C is turned on by input signals received by the input lines 712A, 712B and 712C, then a ground is provided to load device transistors 716. The load device transistors 716 are attached to the interconnect lines 714. The load device transistors 716 provide a low voltage level when any one of the floating gate driver transistors, 701-1, 701-2, . . . , 701-N connected to the corresponding output line is activated. This performs the NOR logic circuit function, an inversion of the OR circuit function results from inversion of data onto the interconnect lines 714 through the floating gate driver transistors, 701-1, 701-2, . . . , 701-N of the array 700. When the floating gate driver transistors, 701-1, 701-2, . . . , 701-N are in an off state, an open is provided to the drain of the load device transistors 716. The VDD voltage level is applied to corresponding input lines, e.g. the interconnect lines 714 for second logic plane 722 when a load device transistors 716 is turned on by a clock signal received at the gate of the load device transistors 716 ($\Phi$).

In a similar manner, second logic plane 722 comprises a second array of floating gate driver transistors, 702-1, 702-2, . . . , 702-N that are selectively programmed to provide the second level of the two level logic needed to implement a specific logical function. In this embodiment, the array of floating gate driver transistors, 702-1, 702-2, . . . , 702-N is also configured such that the output lines 720 comprise a logical NOR function of the signals from the interconnection lines 714 that are coupled to particular output lines through the floating gate driver transistors, 702-1, 702-2, . . . , 702-N of the second logic plane 722.

Programmability of the vertical floating gate driver transistors, 702-1, 702-2, . . . , 702-N is achieved by charging the vertical floating gate. When the vertical floating gate is charged, that floating gate driver transistor, 702-1, 702-2, . . . , 702-N will remain in an off state until it is reprogrammed. Applying and removing a charge to the vertical floating gates is discussed in more detail in connection with FIGS. 5A–5E. A floating gate driver transistors, 702-1, 702-2, . . . , 702-N programmed in an off state remains in that state until the charge is removed from the vertical floating gate.

Floating gate driver transistors, 702-1, 702-2, . . . , 702-N not having a corresponding vertical floating gate charged operate in either an on state or an off state, wherein signals received by the interconnect lines 714 determine the applicable state. If any interconnect lines 714 is turned on, then a ground is provided to load device transistors 724. The load device transistors 724 are attached to the output lines 720. The load device transistors 724 provide a low voltage level when any one of the floating gate driver transistors, 702-1, 702-2, . . . , 702-N connected to the corresponding output line is activated. This performs the NOR logic circuit function, an inversion of the OR circuit function results from inversion of data onto the output lines 720 through the floating gate driver transistors, 702-1, 702-2, . . . , 702-N of the array 700. When the floating gate driver transistors, 702-1, 702-2, . . . , 702-N are in an off state, an open is provided to the drain of the load device transistors 724. The VDD voltage level is applied to corresponding output lines 720 for second logic plane 722 when a load device transistor 724 is turned on by a clock signal received at the gate of the load device transistors 724 ($\Phi$). In this manner a NOR-NOR electrically programmable logic array is most easily implemented utilizing the normal PLA array structure.

Thus FIG. 7 shows the application of the novel, nonvolatile floating gate transistors in a logic array. If a floating gate driver transistors, 701-1, 701-2,..., 701-N, and 702-1, 702-2,..., 702-N, is programmed with a negative charge on the vertical floating gate it is effectively removed from the array. In this manner the array logic functions can be programmed even when the circuit is in the final circuit or in the field and being used in a system.

Figure 8:
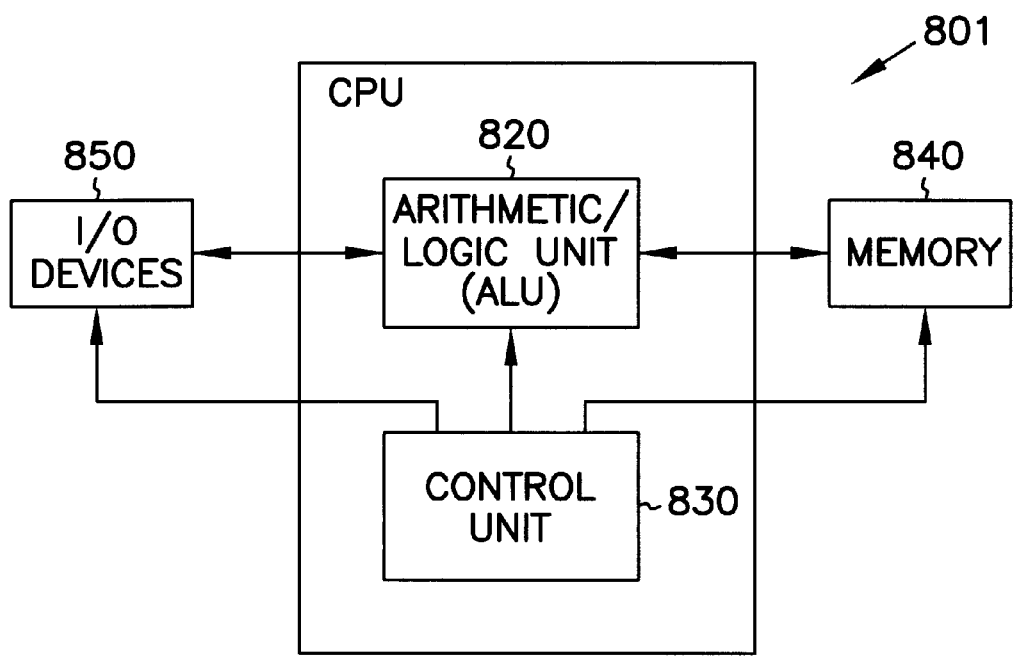
FIG. 8 is a simplified block diagram of a high-level organization of an electronic system according to the teachings of the present invention.

FIG. 8 is a simplified block diagram of a high-level organization of an electronic system 800 according to the teachings of the present invention. As shown in FIG. 8, the electronic system 800 is a system whose functional elements consist of an arithmetic/logic unit (ALU), e.g. processor 820, a control unit 830, a memory unit 840 and an input/ output (I/O) device 850. Generally such an electronic system 8600 will have a native set of instructions that specify operations to be performed on data by the ALU 820 and other interactions between the ALU 820, the memory unit 840 and the I/O devices 850. The memory units 840 contain the data plus a stored list of instructions.

The control unit 830 coordinates all operations of the ALU 820, the memory unit 840 and the I/O devices 850 by continuously cycling through a set of operations that cause instructions to be fetched from the memory unit 840 and executed. Field programmable logic arrays, according to the teachings of the present invention, can be implemented to perform many of the logic functions performed by these components. With respect to the ALU 820, the control unit 830 and the I/O devices 850, arbitrary logic functions may be realized in the "sum-of-products" form that is well known to one skilled in the art. A logic function sum-of-products may be implemented using any of the equivalent two-level logic configurations: AND-OR, NAND-NAND, NOR-OR, OR-NOR, AND-NOR, NAND-AND or OR-AND.

The Figures presented and described in detail above are similarly useful in describing method of operation embodiments of the present invention. That is one method embodiment of the present invention includes operating a novel field programmable logic array having a number of non volatile memory cells. Operating the novel (FPLA) includes selectively storing a charge on at least one of the number of non volatile memory cells. Selectively storing the charge on the at least one of the non volatile memory cells includes storing a charge on a vertical floating gate above a horizontal substrate. Storing the charge on the vertical floating gate controls an electrical conduction between a source and a drain region in the horizontal substrate. Selectively storing a charge on at least one of the vertical floating gates includes removing that non volatile memory cell from the array. The method further includes applying a potential to a vertical control gate opposing the vertical floating gate in the number of non volatile memory cells in the array. In one embodiment, applying a potential to a vertical control gate opposing the vertical floating gate in the number of non volatile memory cells in the array includes applying a potential of less than 2 Volts in order to read a state of the non volatile memory cells in the FPLA. Selectively storing a charge on at least one of the floating gates for the number of non volatile memory cells includes controlling a threshold voltage (Vt) for operating the conduction between a source and a drain region in the horizontal substrate. According to the teachings of the present invention, selectively storing a charge on at least one of the vertical floating gates includes programming the at least one of the vertical floating gates using an applied voltage of between 5 to 7 Volts on the vertical control gate.

Additionally the method includes selectively removing a charge from at least one of the vertical floating gates for the number of non volatile memory cells. Selectively removing the charge on the at least one of the floating gates includes programming the at least one of the vertical floating gates using a negative applied voltage of between 5 to 7 Volts on the vertical control gate. Applying a potential to a vertical control gate opposing the vertical floating gate in the number of non volatile memory cells in the array includes applying a potential such that a majority of an applied voltage to the vertical control gate will appear between the vertical floating gate and the horizontal substrate.

Another method embodiment of the present invention includes operating a field programmable logic array having a number of non volatile memory cells. The method includes selectively applying a first potential across a thin tunneling oxide between a vertical floating gate and a first portion of a horizontal substrate in order to add or remove a charge from the floating gate. The horizontal substrate includes a source region and a drain region separated by a horizontal channel region. The method further includes reading the memory cell by applying a second potential to a vertical control gate located above a second portion of the horizontal substrate. The vertical control gate is parallel to and opposing the vertical floating gate.

CONCLUSION

Thus, structures and methods for programmable logic arrays with logic cells, or floating gate transistors, which can operate with lower applied control gate voltages than conventional programmable logic arrays have been provided. The programmable logic arrays of the present invention do not increase the costs or complexity of the fabrication process. These arrays and methods are fully scalable with shrinking design rules and feature sizes in order to provide even higher density integrated circuits. The total capacitance of the logic cells within the programmable logic arrays is about the same as that for the prior art of comparable source and drain spacings. However, according to the teachings of the present invention, the floating gate capacitance in the logic cells is much smaller than the control gate capacitance such that the majority of any voltage applied to the control gate will appear across the floating gate thin tunnel oxide. Thus, the logic cells in the PLA's of the present invention can be programmed by tunneling of electrons to and from the silicon substrate at lower control gate voltages than is possible in the prior art.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An electronic system, comprising:

a memory;

a processor coupled to the memory; and wherein the processor includes at least one programmable logic array including:

a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes:
a horizontal substrate, wherein the substrate includes a source region, a drain region, and a channel region separating the source and the drain region;
a vertical floating gate located above a first portion of the channel region adjacent to the source region and separated from the channel region by a first oxide thickness; and
a vertical control gate located above a second portion of the channel region adjacent to the drain region and separated from the channel region by a second oxide thickness.

2. The electronic system of claim 1, wherein the vertical floating gate and the vertical control gate include polysilicon gates which are separated from one another by silicon dioxide ($SiO_2$).

3. The electronic system of claim 1, wherein the vertical floating gate and the vertical control gate each have a horizontal width of approximately 100 nanometers (nm).

4. The electronic system of claim 1, wherein the first oxide thickness is approximately 60 Angstroms (Å), and wherein the second oxide thickness is approximately 100 Angstroms (Å).

5. The electronic system of claim 1, wherein the first logic plane is a NOR logic plane and the second logic plane is a NOR logic plane.

6. The electronic system of claim 1, wherein a charge stored on the vertical floating gate located above a first portion of the channel region adjacent to the source region controls electrical conduction between the source regions and the drain regions.

7. The electronic system of claim 1, wherein the processor is coupled to the memory on a single die.

8. An electronic system, comprising:
a memory;
a processor coupled to the memory, the processor including at least one logic cell, including:
a first source/drain region formed in a substrate;
a second source/drain region formed in the substrate;
a channel region separating the first and second source/drain region;
a first gate formed with a long axis substantially perpendicular to the channel region, the first gate located above a first portion of the channel region adjacent to the source region and separated from the channel region by a first oxide thickness; and
a second gate formed with a long axis substantially perpendicular to the channel region, the second gate located above a second portion of the channel region and separated from the channel region by a second oxide thickness.

9. The electronic system of claim 8, wherein the first gate and the second gate include polysilicon gates which are separated from one another by silicon dioxide ($SiO_2$).

10. The electronic system of claim 8, wherein the first gate and the second gate each have a width measured parallel to the channel region of approximately 100 nanometers (nm).

11. The electronic system of claim 8, wherein the first oxide thickness is approximately 60 Angstroms (Å), and wherein the second oxide thickness is approximately 100 Angstroms (Å).

12. The electronic system of claim 8, wherein the processor is coupled to the memory on a single die.

13. An electronic system, comprising:
a memory;
a processor coupled to the memory, the processor including:
at least one logic cell, including:
a first source/drain region formed in a substrate;
a second source/drain region formed in the substrate;
a channel region separating the first and second source/drain region;
a floating gate formed with a long axis substantially perpendicular to the channel region, the floating gate located above a first portion of the channel region adjacent to the source region and separated from the channel region by a first oxide thickness; and
a control gate formed with a long axis substantially perpendicular to the channel region, the control gate located above a second portion of the channel region and separated from the channel region by a second oxide thickness.

14. The electronic system of claim 13, wherein the floating gate has a long axis dimension of approximately 500 nanometers (nm) and a short axis dimension adjacent to the channel region of approximately 100 nanometers (nm).

15. The electronic system of claim 13, wherein the control gate has a short axis dimension adjacent to the channel region of approximately 100 nanometers (nm).

16. The electronic system of claim 13, wherein the control gate further includes a horizontal member located above the floating gate, wherein the control gate and the horizontal member are separated from the floating gate by an intergate dielectric.

17. The electronic system of claim 13, wherein a capacitance between the control gate and the floating gate is greater than a capacitance between the floating gate and the channel region.

18. An electronic system, comprising:
a memory;
a processor coupled to the memory, the processor including at least one logic cell, including:
a first source/drain region formed in a substrate;
a second source/drain region formed in the substrate;
a channel region separating the first and second source/drain region;
a first gate formed with a long axis substantially perpendicular to the channel region, the first gate located above a first portion of the channel region adjacent to the source region and separated from the channel region by a first oxide thickness;
a second gate formed with a long axis substantially perpendicular to the channel region, the second gate located above a second portion of the channel region and separated from the channel region by a second oxide thickness; and
a third gate formed with a long axis substantially perpendicular to the channel region, the third gate located above a third portion of the channel region and separated from the channel region by the second oxide thickness.

19. The electronic system of claim 18, wherein the first oxide thickness is approximately 60 Angstroms (Å), and wherein the second oxide thickness is approximately 100 Angstroms (Å).

20. The electronic system of claim 18, wherein the processor is coupled to the memory on a single die.

21. The electronic system of claim 18, wherein the second and the third gates are on opposing sides of the first gate.

22. The electronic system of claim 18, wherein the first gate includes a floating gate and wherein the second and the third gates include control gates.

23. The electronic system of claim 18, wherein first gate includes a control gate and wherein the second and the third gates include floating gates.

24. An electronic system, comprising:
a memory;
a processor coupled to the memory, the processor including at least one logic array having a number of logic cells, each logic cell including:
a first source/drain region formed in a substrate;
a second source/drain region formed in the substrate;
a channel region separating the first and second source/drain region;
a first gate formed with a long axis substantially perpendicular to the channel region, the first gate located above a first portion of the channel region adjacent to the source region and separated from the channel region by a first oxide thickness; and
a second gate formed with a long axis substantially perpendicular to the channel region, the second gate located above a second portion of the channel region and separated from the channel region by a second oxide thickness.

25. The electronic system of claim 24, wherein the first gate and the second gate each have a width measured parallel to the channel region of approximately 100 nanometers (nm).

26. The electronic system of claim 24, wherein the first oxide thickness is approximately 60 Angstroms (Å), and wherein the second oxide thickness is approximately 100 Angstroms (Å).

27. The electronic system of claim 24, wherein the processor is coupled to the memory on a single die.

28. An electronic system, comprising:
a memory;
a processor coupled to the memory, the processor including at least one logic array having a number of logic cells, each logic cell including:
a first source/drain region formed in a substrate;
a second source/drain region formed in the substrate;
a channel region separating the first and second source/drain region;
a first gate formed with a long axis substantially perpendicular to the channel region, the first gate located above a first portion of the channel region adjacent to the source region and separated from the channel region by a first oxide thickness;
a second gate formed with a long axis substantially perpendicular to the channel region, the second gate located above a second portion of the channel region and separated from the channel region by a second oxide thickness; and
a third gate formed with a long axis substantially perpendicular to the channel region, the third gate located above a third portion of the channel region and separated from the channel region by the second oxide thickness.

29. The electronic system of claim 28, wherein the processor is coupled to the memory on a single die.

30. The electronic system of claim 29, wherein the second and the third gates are on opposing sides of the first gate.

31. The electronic system of claim 29, wherein the first gate includes a floating gate and wherein the second and the third gates include control gates.

32. The electronic system of claim 29, wherein first gate includes a control gate and wherein the second and the third gates include floating gates.

33. An electronic system, comprising:
a memory;
a processor coupled to the memory, the processor including at least one logic cell, including:
a first source/drain region formed in a substrate;
a second source/drain region formed in the substrate;
a channel region separating the first and second source/drain region;
a first gate formed with a long axis substantially perpendicular to the channel region, the first gate located above a first portion of the channel region adjacent to the source region and separated from the channel region by a first oxide thickness;
a second gate formed with a long axis substantially perpendicular to the channel region, the second gate located above a second portion of the channel region and separated from the channel region by a second oxide thickness; and
a member formed substantially parallel to the channel region, and coupled to the second gate above the first gate, wherein the member and the second gate are separated from the first gate by an intergate dielectric.

34. The electronic system of claim 33, wherein the first gate and the second gate each have a width measured parallel to the channel region of approximately 100 nanometers (nm).

35. The electronic system of claim 33, wherein the first oxide thickness is approximately 60 Angstroms (Å), and wherein the second oxide thickness is approximately 100 Angstroms (Å).

36. The electronic system of claim 33, wherein the processor is coupled to the memory on a single die.

37. An electronic system, comprising:
a memory;
a processor coupled to the memory, the processor including at least one logic cell, including:
a first source/drain region formed in a substrate;
a second source/drain region formed in the substrate;
a channel region separating the first and second source/drain region;
a first gate formed with a long axis substantially perpendicular to the channel region, the first gate located above a first portion of the channel region adjacent to the source region and separated from the channel region by a first oxide thickness;
a second gate formed with a long axis substantially perpendicular to the channel region, the second gate located above a second portion of the channel region and separated from the channel region by a second oxide thickness;
a third gate formed with a long axis substantially perpendicular to the channel region, the third gate located above a third portion of the channel region and separated from the channel region by the second oxide thickness; and
a connecting member electrically coupling the second gate and the third gate.

38. The electronic system of claim 37, wherein the processor is coupled to the memory on a single die.

39. The electronic system of claim 37, wherein the second and the third gates are on opposing sides of the first gate.

40. The electronic system of claim 37, wherein the first gate includes a floating gate and wherein the second and the third gates include control gates.

* * * * *

UNITED STATES PATENT AND TRADEMARK OFFICE
CERTIFICATE OF CORRECTION

PATENT NO. : 6,512,695 B2
DATED : January 28, 2003
INVENTOR(S) : Leonard Forbes and Kie Y. Ahn It is certified that error appears in the above-identified patent and that said Letters Patent is hereby corrected as shown below:

Title page,
Item [56], OTHER PUBLICATIONS,
"Chen, W., et al.," reference, insert -- , -- after "*17*(5)".
"Moore, Will, R.," reference, delete "Ccircuit" and insert -- Circuit -- therefor.

Column 4,
Line 39 and 48, delete "between" before "respective".
Line 58, delete "or" and insert -- for -- therefor.

Column 6,
Line 43, delete second instance of "between the".

Column 8,
Line 2, delete second instance of "between the".

Column 12,
Line 9, delete "describe" and insert -- described -- therefor.

Signed and Sealed this

Eighth Day of July, 2003

JAMES E. ROGAN
*Director of the United States Patent and Trademark Office*